United States Patent [19]
Jain et al.

[11] Patent Number: 5,322,573
[45] Date of Patent: Jun. 21, 1994

[54] INP SOLAR CELL WITH WINDOW LAYER

[75] Inventors: Raj K. Jain, North Olmsted; Geoffrey A. Landis, Brookpark, both of Ohio

[73] Assignee: The United States of America as represented by the Administrator of the National Aeronautics and Space Administration, Washington, D.C.

[21] Appl. No.: 955,512

[22] Filed: Oct. 2, 1992

[51] Int. Cl.$^5$ ............................................. H01L 31/06
[52] U.S. Cl. .................................. 136/252; 136/256; 437/5; 257/76; 257/434; 257/631
[58] Field of Search ................... 136/252, 256, 249 TJ, 136/262; 437/5, 938; 257/76, 434, 631

[56] References Cited
U.S. PATENT DOCUMENTS 4,591,654  5/1986  Yamaguchi et al. ................ 136/252

OTHER PUBLICATIONS

Aina et al, *Appln. Phys.* 53(17), pp. 1620–1622 (Oct. 1988).
Landis et al., *IEEE Transactions on Electron Devices*, vol. 37, No. 2 (1990).
R. K. Jain et al, *Appl. Phys. Lett.*, vol. 59, pp. 2555–2557 (Nov. 1991).
L. Aina et al, *Appl. Phys. Lett.*, vol. 51, p. 1637 (Nov. 1987).
M. B. Spitzer et al, *Conference Record, 21st IEEE Photovoltaic Specialists Conf.* (May 1990), pp. 196–206.

*Primary Examiner*—Aaron Weisstuch
*Attorney, Agent, or Firm*—Guy M. Miller; James A. Mackin; Gene E. Shook

[57] ABSTRACT

The invention features a thin light transmissive layer of the ternary semiconductor indium aluminum arsenide (InAlAs) as a front surface passivation or "window" layer for p-on-n InP solar cells. The window layers of the invention effectively reduce front surface recombination of the object semiconductors thereby increasing the efficiency of the cells.

9 Claims, 2 Drawing Sheets

INP SOLAR CELL WITH WINDOW LAYER

The invention described herein was made in performance of work under NASA Contract No. NAS-33-25266, and is subject to the provision of 305 of the National Aeronautics and Space Act of 1958, as amended, (42 U.S.C. § 2457).

BACKGROUND OF THE INVENTION

The invention relates to indium phosphide (InP) semiconductor devices, and more particularly to a method of improving the efficiency of InP solar cells and other photo-receivers, and the improved cells produced thereby. InP solar cells have excellent radiation tolerance and the potential for extremely high efficiency. However, to date InP solar cells have not equalled the efficiency of other materials such as GaAs because of its propensity for high recombination of minority carriers at the front surface of the cell. The purpose of this invention is to increase the efficiency of InP solar cells by reducing the recombination of minority carriers at the front surface.

In InP, one of the most significant causes of poor efficiency is the recombination of electrons and holes at the front surface of the device, a process called surface recombination. Experimentally measured values of surface recombination velocity (SRV) on InP solar cells are extremely high. The surface recombination velocity calculated from measured values of the short wavelength quantum efficiency and current-voltage characteristics of the best existing InP solar cells is in the range of $5 \times 10^6$ to $10^7$ cm/s, which is unfavorably high. Once recombined at the surface, the carriers are lost and cannot contribute to either the output voltage or the output current of the cell.

High front surface recombination in InP cells is typically addressed by using n-on-p cell configurations, where n-type InP is used as the front surface or "emitter" layer. High doping (n+) levels in the n-InP and extremely shallow emitter layers contribute to minimize surface losses in the emitter. However, the best n-on-p type InP cells have 19% conversion efficiency measured at Air Mass Zero (AM0), and the best p-on-n InP cells today have efficiencies of 15% AM0. Thus, with the present technology, p-on-n cells are not as efficient as n-on-p cells, and neither is as efficient as GaAs cells, which have been manufactured with over 22% efficiency.

In front surface recombination velocity could be reduced, theoretical studies by the inventors indicate that p-on-n cells would have better open circuit voltage and higher efficiency than n-on-p cells. The heavy doping of the emitter required in n-on-p cells to minimize the adverse effects of high surface recombination leads to efficiency loss. The shallow emitter required is difficult to fabricate and has high resistance, leading to further losses.

Some InP solar cells have been made using as the active material InP which has been deposited or "grown" on a substrate of a different crystalline material. This is advantageous because a substrate may be used which is stronger, lighter or lower in cost than single crystal wafers of InP, while retaining all of the features of an InP solar cell. Two crystalline substrates of particular interest are silicon and germanium, which are available in wafer form. A difficulty in this approach, however, is that in the process of growing the InP, the Si or Ge will tend to diffuse from the substrate into the InP layer being grown, doping the InP to n-type. The p-on-n type solar cell is preferable for this application because it can make use of the n-type doping in the base. Thus, reduction of surface recombination in p-on-n type InP is particularly important for these cell designs.

InP solar cells can also be used as one element in a tandem solar cell, where it is used in conjunction with other solar cell materials. For example, an InP solar cell may be used on top of an InGaAsP solar cell, so that the light which penetrates through the InP can be usefully absorbed by the InGaAsP.

Finally, while the devices discussed in detail are solar cells, other electronic devices designed to absorb light, such as photodetectors, photodiodes, phototransistors, laser power receivers, thermophotovoltaic cells and the like could also be fabricated out of InP and would likewise benefit from reduced surface recombination at the light absorbing surface. Hence, there is a need for alternative methods of minimizing the effects of high surface recombination velocities in InP that do not have the disadvantages associated with current methods. By increasing the efficiency of InP devices, and in particular p-on-n InP, in this way, they will become more suitable for space power applications where their excellent radiation tolerance can be exploited.

SUMMARY OF THE INVENTION

The invention provides an alternative means of overcoming the adverse effects of high surface recombination velocities (SRV) in InP without the disadvantages of prior methods. Moreover, the invention makes possible the advantageous use of p-on-n InP in solar cells and other light actuated devices or photo-receivers. Surface recombination is reduced by putting an electrical energy barrier between the place where the light is absorbed and the surface of the InP, so that the carriers cannot get to the surface to recombine. This can be accomplished by introducing a heterojunction window layer that has a bandgap wider than the InP on the front surface of the InP. Heterojunction layers to reduce front surface recombination velocity have not been previously used on high-efficiency InP solar cells.

The present invention features a thin light transmissive layer of the ternary semiconductor indium aluminum arsenide (InAlAs) as a front surface passivation or "window" layer for p-on-n InP semiconductor devices, such as solar cells. The InAlAs employed in the invention has a bandgap of about 1.465 eV, slightly wider than that of InP, and is lattice matched to InP at a composition of approximately $In_{0.52}Al_{0.48}As$. Experimental work indicates that the InP/InAlAs heterojunction forms a "stagger" alignment, with the discontinuity in conduction band energy greater than the difference in band gaps. This means that InAlAs will form a barrier to electrons, but a sink for holes. Hence InAlAs will be effective for reducing SRV on p-type InP. The inventive InAlAs window layer improves both the short circuit current density and the open circuit voltage, yielding significant improvements in efficiency as described in R. K. Jain and G. A. Landis, Appl. Phys. Lett., 59(20), p. 2555 (1991), incorporated herein by reference.

Wide bandgap heterojunction window layers, i.e., layers having a bandgap significantly wider than the bandgap of the underlying material, have been used on other semiconductor materials to reduce surface recombination. For example, AlGaAs layers have been used on GaAs solar cells. Since AlAs has an almost identical lattice constant to GaAs, any composition of AlGaAs will be lattice matched to a GaAs substrate and there is no need to use any particular composition of AlGaAs. Moreover, the wide bandgap of AlGaAs, which can be as much as 0.74 eV higher than that of GaAs for high aluminum content material, means that AlGaAs can be used as a window layer on either p-type or n-type GaAs.

By contrast, the bandgap of InAlAs is only marginally wider than that of InP. The bandgap increase from InP to lattice-matched InAlAs is only 0.115 eV, significantly less than the increase from GaAs to AlGaAs. The low difference in bandgaps between InP and InAlAs means that band-bending effects can be significant compared to the change in bandgap energy. In fact, band-bending effects due to the 0.294 eV discontinuity in the conduction band energies are larger in energy than the barrier due to the increase in bandgap, which means that a lattice matched InAlAs layer will not be effective on n-type InP. The inventors have solved this problem by using the InAlAs layer on p-type InP, where the discontinuity in conduction band energy is favorable.

The low difference in bandgaps also means that InAlAs absorbs light nearly as efficiently as InP, and hence thick InAlAs will not work well as a window layer, which must be nearly transparent to light. Hence, the effectiveness of InAlAs as a window layer is significantly dependent on thickness.

InAlAs has been used in conjunction with InP for several other types of semiconductor devices, including high-electron mobility transistors (HEMTS), quantum wells, and heterojunction base transistors. In these devices the InAlAs is typically used as a layer in contact with InGaAs, and in most applications is not doped. In these devices, the InAlAs is not used as a window layer on the surface, is not designed to be light transmissive to incident light, is usually either n-type or undoped rather than p-type, and is not used to decrease surface recombination of minority carriers.

While the invention is primarily aimed at improving InP solar cells, it may be used in other applications as well, such as for improving the efficiency of InP photodetectors and their sensitivity to short wavelength light. The invention enables novel high-efficiency p-on-n type InP devices to be made. This cannot be achieved by methods known to the prior art. The solar cell of the invention will be of higher efficiency than any other known radiation-tolerant solar cell, and hence will have many applications for use in space power.

In accordance with the foregoing it is an object of the invention to provide an indium phosphide photo-receiving semiconductor device comprising a first layer of indium phosphide having a front surface for receiving light, a second layer of indium phosphide forming a semiconductor junction with said first layer, and a light transmissive window layer of semiconductor material disposed on said front surface of said first layer of indium phosphide, said material being substantially lattice matched to said InP and having a wider bandgap than said InP. Preferably, the first layer of InP is p-type and the second layer of InP is n-type and the window layer is from about 10 nm to about 100 nm thick. Still more preferably the window layer is p-type and selected from AlAsSb or InAlAs.

A preferred embodiment of the invention is an indium phosphide photo-receiving semiconductor device comprising a first layer of p-type indium phosphide having a front surface for receiving light, a second layer of n-type indium phosphide forming a semiconductor junction with said first layer, and a light transmissive window layer of InAlAs disposed on said front surface of said first layer of indium phosphide. Preferably, the InAlAs is substantially lattice matched to the InP and still more preferably is of the composition $In_{0.52}Al_{0.48}As$ and from about 10 nm to about 100 nm thick. In yet another embodiment the second layer of InP is disposed on a supporting substrate comprising germanium or silicon.

In another embodiment there is provided a method of improving the efficiency of a multilayer indium phosphide semiconductor device having first and second layers of indium phosphide forming a semiconductor junction therebetween, said first layer having a front surface for receiving light. The method according to this embodiment comprises reducing surface recombination by forming a light transmissive window layer of substantially lattice matched semiconductor material having a bandgap wider than said indium phosphide on said front surface of said first layer of indium phosphide. In a preferred method the window layer is formed of InAlAs or AlAsSb to a thickness of from about 10 to about 100 nm thick.

Still more preferably, the invention provides a method of improving the efficiency of a multilayer indium phosphide semiconductor device having a first layer of p-InP and a second layer of n-InP forming a semiconductor junction therebetween, said first layer having a front surface for receiving light, said method comprising reducing surface recombination by forming a light transmissive window layer of p-type InAlAs on said front surface of said first layer of indium phosphide. Preferably the method comprises forming the InAlAs substantially lattice matched to the InP and still more preferably forming the window layer of $In_{0.52}Al_{0.48}As$ from about 10 nm to about 100 nm thick.

Many additional features, advantages and a fuller understanding of the invention will be had from the following detailed description of the preferred embodiments and accompanying drawings.

DETAILED DESCRIPTION OF THE PREFERRED EMBODIMENTS

Figure 1:
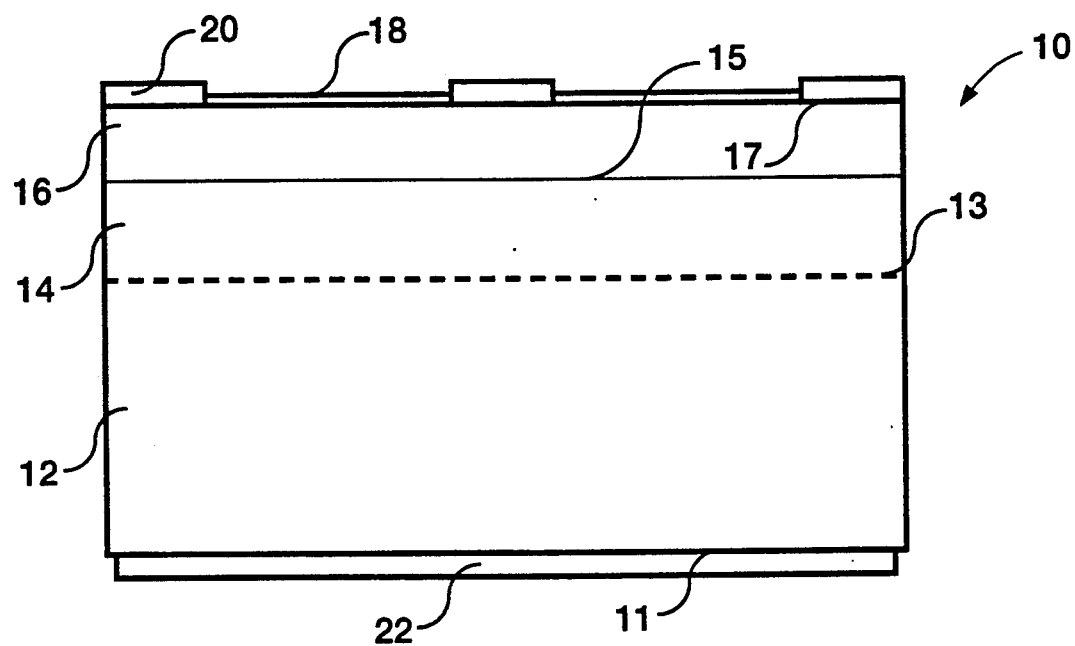
FIG. 1 is a diagrammatic cross-sectional view of a device according to the invention.

FIG. 1 shows the general configuration of a semiconductor device constructed according to the invention. As shown, a solar cell 10 is comprised of a first layer 14 of p-type InP as the emitter and a second layer 12 of n-type InP as the base. The first and second layers of InP form a p/n semiconductor junction 13 at their interface. The front surface 15 of the emitter 14 is the surface upon which light is incident on the solar cell. The inventive InAlAs window layer 16 is disposed on the front surface of the emitter layer 14. The InAlAs window layer 16 is thin enough so as to be substantially transparent to light in the solar spectrum. Front surface current carrying contacts 20 are disposed on the front surface 17 of the InAlAs window layer 16 and back surface current carrying contacts 22 are disposed on the back surface 11 of the base layer 12. The device shown includes a front surface antireflection (AR) coating 18 disposed on the front surface of the window layer 16.

It is to be understood that the form of the device depicted in FIG. 1 has been chosen only for the purpose of describing a particular embodiment and function of the invention, and that variations in the configuration of the semiconductor device will be apparent to one of ordinary skill in the art in view of the instant disclosure. For example, parameters such as the doping of the window, emitter, and base layers may be varied to optimize the performance of the cell and to maximize tolerance to radiation. The front surface contacts may be made directly to the p-type InP rather than to the InAlAs. The InAlAs layer may be "capped" by addition of a thin layer of material on top of the InAlAs to prevent corrosion or degradation of the InAlAs due to exposure to the environment. Of course, if this is done the cap material must either be transparent or else thin enough to avoid significant absorption of light. Similarly, the thickness of the layers may be varied and the invention may be used in conjunction with other improvements such as a grooved or reflection-reduced front surface as is known in the art.

The window layer 16 is a light transmissive semiconductor substantially lattice matched to the InP. The semiconductor may be selected from a family of quaternary semiconductors including indium, aluminum, arsenic, and antimony, with the formula $In_{(1-x)}Al_xAs_{(1-y)}Sb_y$, where x and y are greater than zero and less than one. In general, InAlAsSb quaternary materials are more difficult to manufacture than ternary materials and not all of them will have bandgaps wider than that of InP. However, out of the InAlAsSb family, the ternary semiconductors InAlAs and AlAsSb are preferred as window layers because the value of the parameters x and y can be found such that the compositions $AlAs_{1-y}Sb_y$ and $In_{(1-x)}Al_xAs$ are lattice matched to InP and have bandgaps wider than that of InP.

In the preferred embodiment the window layer 16 is formed of the compound InAlAs, which is defined as any material of the family of ternary semiconductors of the formula $In_{(1-x)}Al_xAs$, where x may be any amount greater than zero and less than one. As the parameter x is varied, both the electronic bandgap and the lattice parameter of the semiconductor will change. The window layer 16 is lattice matched to the underlying InP emitter by forming the ternary compound $In_{(1-x)}Al_xAs$, where x is approximately 0.48, whereby the crystal lattice of the InAlAs will match that of the InP substrate. This is advantageous because if the materials are lattice matched, i.e., have the same lattice constant, then crystal growth of the InAlAs layer can take place with a continuation of the same crystalline structure as the underlying InP. This minimizes the number of defects that can form at the InAlAs/InP interface and hence, the principal locations for surface recombination. In the absence of lattice matching, defects are generated at the interface due to the mismatch. These defects allow for the recombination of electron-hole pairs, thereby degrading the device performance.

Some amount of reduction of surface recombination is expected to result with layers composed of any composition of InAlAs that has a bandgap greater than the 1.35 eV bandgap of InP. The widest bandgap in the InAlAs system is achieved with the highest Al content and is about 2.16 eV, but this composition is not lattice matched to InP. It is most desirable to form the InAlAs composition with a lattice constant matched to that of InP. This composition has a bandgap of approximately 1.46 to 1.47 eV. However, if the layer is sufficiently thin, a composition with a lattice constant different from the lattice constant of InP, i.e., a composition slightly mismatched from InP, can be used without the deleterious dislocations at the interface, by the process of strained-layer epitaxy. The required thickness will depend upon how much the lattice constant differs from that of InP. Thicknesses of about 10 nm are expected to be thin enough that strained-layer epitaxy will be possible.

Figure 2:
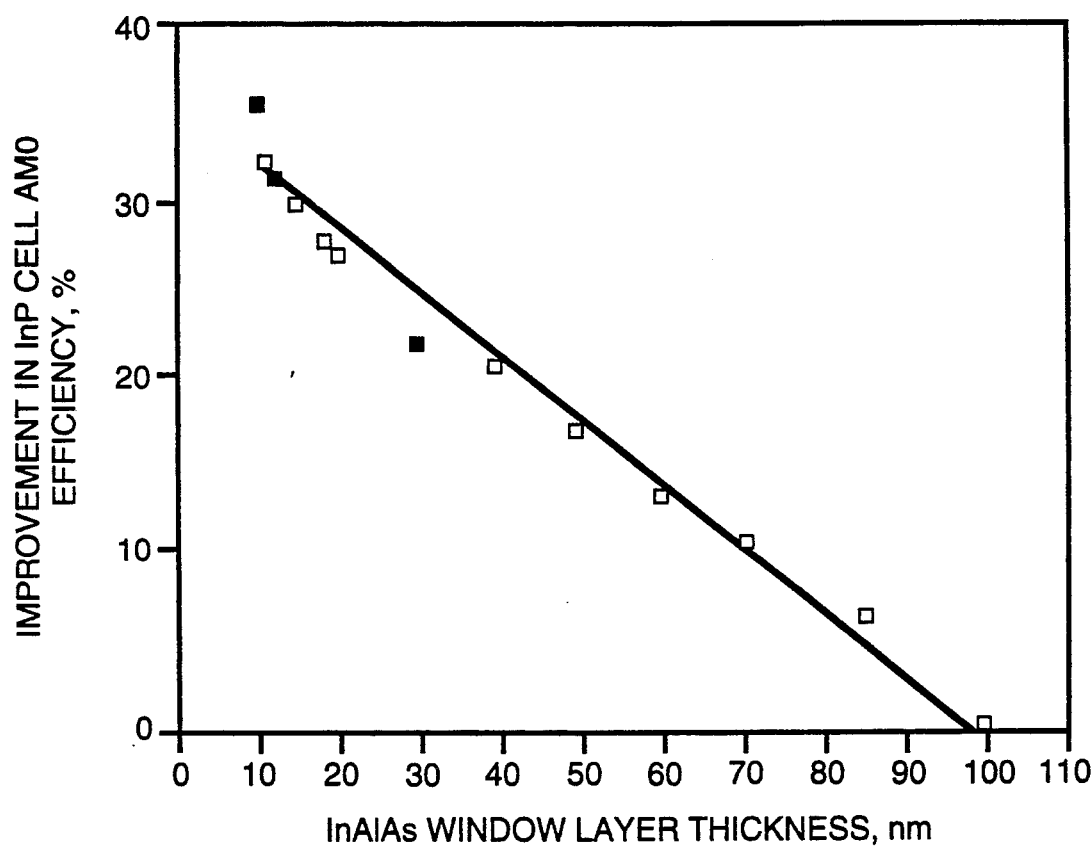
FIG. 2 is a graph of efficiency versus thickness of a cell according to the invention.

FIG. 2 shows the calculated improvement of conversion efficiency as a function of InAlAs window layer thickness. The cell efficiency is best for the thinnest InAlAs layers where the minimum amount of light is absorbed in the window layer. Improvements of more than 30% are predicted for p-on-n InP cells having the inventive InAlAs window layers thinner than 15 nm. The improvement disappears for layers thicker than about 100 nm because losses due to light absorbed by the InAlAs layer outweigh the increases due to the lower effective SRV.

For the advantageous use of p-on-n InP the InAlAs window layer has p-type doping. Typical p-type dopants are zinc and cadmium in amounts ranging from about $10^{15}$ to about $10^{19}$ cm$^{-3}$, with the window layer preferably being doped to about $10^{18}$ cm$^{-3}$.

The use of lattice matched p-type indium aluminum arsenide as a window layer significantly improves the performance of p-on-n type InP solar cells and other optoelectronic devices. The improvement in the p-on-n cell is accounted for by the energy discontinuity at the heterojunction. In the case of the InAlAs/InP heterojunction, it has been measured that the discontinuity in the conduction band energies, approximately 0.294 eV, is more than the difference in the bandgaps of the two materials, e.g., about 0.115 eV. This results in a staggered alignment of the band edges, which provides an energy barrier to minority carrier electrons, and hence reduces surface recombination by making it harder for the electrons to reach the surface.

The InAlAs window layers lattice matched to InP may be grown by methods known to those of ordinary skill in the art, such as atmospheric pressure organometallic vapor phase epitaxy (OMVPE) as described in L. Aina and M. Mattingly, Applied Physics Letters, Vol. 51, No. 20, p. 1637 (1987). Using trimethylaluminum, trimethylindium and arsine as sources of the aluminum, indium and arsenic, respectively, the flow of growth gasses is carried in hydrogen over the InP substrate heated by, for example, RF to the desired growth temperature, e.g., about 650° C. In order to prevent loss of phosphorus from the InP substrate while it is being heated before growth, a flow of phosphine over the substrate may be desirable.

Typically, the ratio of the group V source to the group III source flow rate during growth is about 60, although the optimum ratio will vary depending upon growth conditions. The trimethylaluminum and trimethylindium flow rates are adjusted to produce the desired lattice matched growth, which can be measured using double-crystal x-ray diffraction. P-type doping is achieved using a group II source. A common p-type dopant is zinc, which is incorporated by using diethylzinc as a source gas.

EXAMPLE 1

The modelled cell has a 0.15 μm thick p-type InP emitter doped to $10^{18} cm^{-3}$ and a 5.0 μm thick n-type base doped to $10^{17} cm^{-3}$. The InAlAs window layer is 20 nm thick and has a doping concentration of $10^{18} cm^{-3}$. The cell includes a two-layer antireflection coating comprised of 50 nm of ZnS on 100 nm of $MgF_2$ to reduce light reflection. The front surface contact metallization yielded about 5% grid coverage.

For calculation of the cell parameters minority carrier diffusion lengths of 0.5, 0.5, and 2.0 μm were assumed for the window layer, emitter, and base layers, respectively. The front and back surface SRV was assumed to be $10^7$ cm/s. These values are typical of the current state of the art in p+n InP solar cells. A value of 1.465 eV was used for the band gap of the lattice matched $In_{0.52}Al_{0.48}As$ based on reported values of from 1.46 to 1.47 eV. The discontinuity in the conduction band energy at the heterojunction was 0.294 eV. The numerical code PC-1D was used to solve the semiconductor device transportation equations. The short circuit current density for this cell was 32.7 $mA/cm^2$, the open circuit voltage was 925.6 mV, and the conversion efficiency was 18.74% (AM0).

For comparison, measurements were taken for an identical cell without the InAlAs window layer. For this cell the short circuit current density was 26.9 $mA/cm^2$, the open circuit voltage was 892.7 mV and the efficiency was 14.7% (AM0). It is clear that the cell efficiency improved significantly, with both the short circuit current density and the open circuit voltage improving with the use of the InAlAs layer.

The efficiency gain due to the window layer is even more significant for higher performance cells, since the effect of surface recombination is even more important to the performance of these cells because in such cells other sources of recombination are decreased. For a higher efficiency InP cell with diffusion lengths of 2 μm for the emitter and 5 μm for the base without a window layer, the conversion efficiency is only about 15.5% (AM0), a modest increase over the average 14.7% of the baseline InP cells. Adding a 10 nm InAlAs window layer to such a cell (assuming a 2 μm diffusion length) increased the efficiency to 23.0% AM0, a considerable increase.

Many modifications and variations of the invention will be apparent to those skilled in the art in light of the foregoing detailed disclosure. Therefore, within the scope of the appended claims, the invention can be practiced otherwise than as specifically shown and described.

What is claimed is:

1. An indium phosphide photo-receiving semiconductor device comprising:
    a) a first layer of p-type indium phosphide having a front surface for receiving light;
    b) a second layer of n-type indium phosphide forming a semiconductor junction with said first layer;
    c) a light transmissive window layer of p-type InAlAs disposed on said front surface of said first layer of indium phosphide, said window layer being from about 10 nm to about 100 nm thick, being substantially lattice matched to said first layer of indium phosphide and having a bandgap wider than that of said first layer of indium phosphide, said window layer forming an energy barrier that reduces the recombination of electrons and holes at said front surface of said first layer of indium phosphide whereby the efficiency of the device is increased.

2. The device according to claim 1, wherein the window layer is $In_{0.52}Al_{0.48}As$.

3. The device according to claim 1, wherein said second layer of InP is disposed on a supporting substrate comprising germanium or silicon.

4. The InP device of claim 1 wherein the window layer is $In_{1-x}Al_xAs$ where x has a value in the range from 0.48 to less than 1.00.

5. A method of improving the efficiency of a multilayer indium phosphide semiconductor device having a first layer of p-InP and a second layer of n-InP forming a semiconductor junction therebetween, said first layer having a front surface for receiving light, said method comprising reducing surface recombination by forming a light transmissive window layer of InAlAs from about 10 nm to about 100 nm thick on said front surface of said first layer indium phosphide, and which is substantially lattice matched to said first layer of indium phosphide an having a wider bandgap than said first layer of indium phosphide.

6. The method according to claim 5, further comprising doping said the window layer as p-type.

7. The method according to claim 5, further comprising forming the window layer of $In_{0.52}Al_{0.48}As$.

8. The method according to claim 5, further comprising forming said second layer of InP on a supporting substrate comprising silicon or germanium.

9. The method of claim 5 wherein said window layer is $In_{1-x}Al_xAs$ where x has a value in the range from 0.48 to less than 1.00.

* * * * *